United States Patent [19]
Sinta et al.

[11] Patent Number: 5,919,597
[45] Date of Patent: Jul. 6, 1999

[54] METHODS FOR PREPARING PHOTORESIST COMPOSITIONS

[75] Inventors: Roger F. Sinta, Woburn; Uday Kumar, Natick; George W. Orsula, Harvard; James I. T. Fahey, Mendon, all of Mass.; William R. Brunsvold, Poughkeepsie, N.Y.; Wu-Song Huang, Poughkeepsie, N.Y.; Ahmad D. Katnani, Poughkeepsie, N.Y.; Ronald W. Nunes, Hopewell Junction, N.Y.; Mahmoud M. Khojasteh, Poughkeepsie, N.Y.

[73] Assignees: IBM Corporation of Armonk, New York, N.Y.; Shipley Company, L.L.C. of Marlborough, Marlborough, Mass.

[21] Appl. No.: 08/961,112

[22] Filed: Oct. 30, 1997

[51] Int. Cl.$^6$ ...................................................... G03F 7/004
[52] U.S. Cl. ........................................ 430/270.1; 430/905
[58] Field of Search .................................. 430/270.1, 905

[56] References Cited

U.S. PATENT DOCUMENTS

| | | | |
|---|---|---|---|
| 5,216,111 | 6/1993 | Zampini | 528/143 |
| 5,290,658 | 3/1994 | Uenishi et al. | 430/192 |
| 5,378,586 | 1/1995 | Uetani et al. | 430/192 |
| 5,380,618 | 1/1995 | Kokubo et al. | 430/190 |
| 5,407,778 | 4/1995 | Uetani et al. | 430/192 |

*Primary Examiner*—John S. Chu
*Attorney, Agent, or Firm*—Darryl P. Frickey; Peter F. Corless

[57] ABSTRACT

Methods are provided to prepare photoresists without isolation of various components, i.e. in a "one-pot" procedure. Preferred one-pot preparation methods of the invention include preparing a photoresist resin binder in a selected photoresist solvent and, without isolation of the resin binder from the solvent, adding a photoactive component and any other desired photoresist materials to the resin binder in solution to thereby provide a liquid photoresist composition in the solvent in which the resin binder was prepared. The invention also provides novel methods for synthesizing resist resin binders, particularly phenolic polymers that contain phenolic OH groups covalently bonded to another moiety such as acid labile groups or inert blocking groups.

28 Claims, No Drawings

METHODS FOR PREPARING PHOTORESIST COMPOSITIONS

BACKGROUND OF THE INVENTION

1. Field of the Invention

The present invention relates to methods for preparation of photoresist compositions and, more particularly, to formulation of photoresists in a one-pot procedure as well as other methods for improved resist manufacture.

2. Background

Photoresists are photosensitive films for transfer of images to a substrate and form negative or positive images. After coating a photoresist on a substrate, the coating is exposed through a patterned photomask to a source of activating energy such as ultraviolet light to form a latent image in the photoresist coating. The photomask has areas opaque and transparent to activating radiation that define a desired image to be transferred to the underlying substrate. A relief image is provided by development of the latent image pattern in the resist coating. The use of photoresists is generally described, for example, by Deforest, Photoresist Materials and Processes, McGraw Hill Book Company, New York (1975), and by Moreau, Semiconductor Lithography, Principals, Practices and Materials, Plenum Press, New York (1988).

Current practice provides that photoresists and the components thereof are prepared in multiple step procedures. For example, each of the components of a photoresist composition—such as a resin binder component and photoactive component—are separately prepared and isolated then admixed in a photoresist solvent to prepare the liquid coating composition. Thus, for example, in current practice, a resin binder component is synthesized and then isolated from the reaction solvent. The isolated solid resin material is then typically washed with a non-solvent such as water and dried prior to being dissolved in a photoresist solvent to prepare the resist formulation.

Such a multi-step process can present notable shortcomings. For example, a multiple step procedure can pose significant engineering challenges, particularly for large scale resist production, as well as add substantially to manufacturing costs.

Impurities present in photoresist components also can present problems. For example, soluble impurities such as moisture may be present from the manufacture of resist components and from the packaging containers or dispensing tanks. Such impurities can render a photoresist unsuitable for its intended purpose, e.g. damage an integrated circuit manufactured with the resist.

It thus would be desirable to have new methods for preparation of photoresist compositions. It would be particularly desirable to have new production methods that reduce the steps required to produce a resist. It would be further desirable to have new methods for producing photoresists of enhanced purity.

SUMMARY OF THE INVENTION

We have now discovered new and highly convenient methods for the preparation of photoresist compositions.

In a preferred aspect, methods are provided to prepare photoresists without isolation of various components, i.e. in a "one-pot" procedure. Preferred one-pot preparation methods of the invention include preparing a photoresist resin binder in a selected photoresist solvent and, without isolation of the resin binder from the solvent, adding a photoactive component and any other desired photoresist materials (e.g. crosslinker for negative resist, dye, etc.) to the resin binder in solution to thereby provide a liquid photoresist composition in the solvent in which the resin binder was prepared.

In the one-pot reaction, preferably a phenolic polymer ("resin binder precursor") is condensed with a compound ("addition compound") that functionalizes available phenolic OH sites of the resin binder precursor. In particular, acid labile groups or inert blocking groups can be covalently linked to the pendant hydroxyl sites of a phenolic resin such as a poly(vinylphenol) or novolak. Suitable acid labile groups and inert blocking groups are disclosed in U.S. Pat. No. 5,258,257 to Sinta et al. and U.S. Pat. No. 5,514,520 to Thackeray et al. respectively.

In addition to savings of manufacturing time and costs, it has been found that the one-pot preparation methods of the invention provide resist formulations that can exhibit significantly enhanced shelf life at room temperature relative to comparable formulations that are prepared in multi-step procedures.

The invention provides further methods for synthesizing resist resin binders, particularly phenolic polymers that contain phenolic OH groups covalently bonded to another moiety such as the above-mentioned acid labile groups or inert blocking groups.

A preferred synthetic method comprises reacting a resist resin binder precursor and an addition compound reactive with the resin binder precursor under substantially anhydrous conditions, e.g. less than 1 wt. % of water, more preferably less than 0.8 wt. % or 0.5 wt. % of water, or even less than about 0.2 wt. % or 0.1 wt. % water, based on total weight of the reaction mixture. The anhydrous reaction conditions may be employed in a multi-step resist preparation process as well as in the above-described one-pot preparative methods of the invention.

A variety of approaches can be employed to provide such an anhydrous reaction mixture. A preferred method includes treatment of the resin binder precursor in solution with molecular sieves prior to reaction with the addition compound. Alternatively, a solution of the resin binder precursor can be azeotroped prior to reaction with the addition compound.

Such water removal provides surprising advantages. In particular, the water removal substantially increases the efficiency of the reaction of the resin binder precursor with the addition compound. For example, in a comparative study, a resin binder precursor had 50% greater substitution by the addition compound under anhydrous conditions as disclosed herein relative to the same resin binder precursor that was reacted with the same addition compound but where water removal procedures were not performed.

Additionally, it has been found that water removal reduces undesired high molecular weight polymeric material that can form during reaction of the resin binder precursor and addition compound. Such high molecular weight materials can be unstable and reduce the shelf life of photoresists containing the material.

The invention also provides further methods for resist resin binder synthesis that can significantly enhance shelf life of photoresists comprising the resin binder. These methods include contacting an ion exchange material with a phenolic resin binder having pendant acid labile groups or inert blocking groups, promptly after the resin binder has been synthesized. A basic ion exchange material is employed if the resin binder was synthesized via an acidicmediated condensation, and an acidic ion exchange material is employed if the resin binder was synthesized via an alkaline-mediated condensation. Typically, the ion exchange material is contacted with the phenolic resin binder immediately after completion of the reaction grafting on the pendant acid labile groups or inert blocking groups, and prior to any isolation or other processing of the resin binder. It has been found that the ion exchange material can remove acid or base catalyst residues and enhance shelf life of the polymer and resist composition that contains the polymer. Such use of an ion exchange material may be employed in a multi-step resist preparation process or, more preferably, in the above-described one-pot procedure of the invention.

As indicated above, the term "resin binder precursor" designates herein a oligomer or polymer prior to an addition reaction that provides a polymeric resin binder as used in a photoresist composition. Thus, for example, for a photoresist resin binder that is a phenolic polymer that has pendant acid labile or inert blocking groups grafted onto the polymer's hydroxyl groups, a resin binder precursor would be the phenolic polymer prior to the addition reaction that functionalizes the phenolic OH groups with the pendant acid labile or inert blocking groups.

In turn, "addition compound" designates herein a compound that is reacted with a resin binder precursor to provide a resin binder as would be used in a photoresist composition. Thus, for example, in the case of a phenolic resin binder precursor, addition compounds would be compounds reacted with the precursor to provide a desired functionality on the precursor such as acid labile groups (addition compound could contain acid labile moiety with leaving group e.g. di-t-butylcarbonate or t-butyl chloroacetate) or inert blocking groups (addition compound could contain inert blocking moiety with leaving group e.g. methanesulfonic acid chloride).

Other aspects of the invention are discussed infra.

DETAILED DESCRIPTION OF THE INVENTION

As stated above, in a first aspect, the invention provides methods for one-pot photoresist manufacture.

The one-pot methods include forming a photoresist resin binder in a solvent to be used for the prepared photoresist composition.

In preferred aspects, the resin binder is a phenolic binder that contains phenolic OH sites bonded to another moiety such as acid labile groups e.g. those groups disclosed in U.S. Pat. No. 5,258,257 to Sinta et al., or inert blocking groups as described in U.S. Pat. No. 5,514,520 to Thackeray et al.

Preferred phenolic resins that can be employed as resin binder precursor include novolak and poly(vinylphenol) resins. Preparation of such phenolic resins is known. Examples of suitable phenols for condensation with an aldehyde, especially formaldehyde, for the formation of novolak resins include phenol; m-cresol; o-cresol; p-cresol; 2,4-xylenol; 2,5-xylenol; 3,4-xylenol; 3,5-xylenol; thymol and mixtures thereof. An acid catalyzed condensation reaction results in formation of a suitable novolak resin which may vary in molecular weight from about 500 to 100,000 daltons. Poly(vinylphenols) may be prepared, e.g., as disclosed in U.S. Pat. No. 4,439,516. Preferred resins and the preparation thereof are also disclosed in U.S. Pat. No. 5,128,230.

Poly(vinylphenols) may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarin, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinylphenol resins prepared from such vinylphenols have a molecular weight range of from about 2,000 to about 60,000 daltons.

Copolymers containing phenol and nonaromatic cyclic alcohol units also are preferred resin binder precursors and may be suitably prepared by partial hydrogenation of a novolak or poly(vinylphenol) resin. Such copolymers and the use thereof in photoresist compositions are disclosed in U.S. Pat. No. 5,128,232 to Thackeray et al.

Further preferred resin binder precursors include resins formed from bishydroxymethylated compounds, and block novolak resins. See U.S. Pat. Nos. 5,130,410 and 5,128,230 where such resins and use of same in photoresist compositions are disclosed. Additionally, two or more resins of similar or different compositions can be blended or combined together to give additive control of lithographic properties of a photoresist composition. For instance, blends of resins can be used to adjust photospeed and thermal properties and to control dissolution behavior of a resist in a developer.

Acetate groups are preferred acid labile groups to functionalize phenolic OH moieties of a phenolic resin binder precursor. To provide such groups, a phenolic resin binder precursor may be condensed with a suitable addition compound such as a compound of the formula $L-CR^1R^2C(=O)-O-R^3$, where L is a leaving group such as bromide or chloride, $R^1$ and $R^2$ are each independently hydrogen, an electron withdrawing group such as halogen (particularly F, Cl or Br), or substituted or unsubstituted $C_{1-10}$ alkyl; and $R^3$ is substituted or unsubstituted $C_{1-10}$ alkyl, or substituted or unsubstituted aryl such as phenyl or aryalkyl such as benzyl. Condensation of such addition compound provides the groups of the formula $-R^1R^2C(=O)-O-R^3$ pendant to the resin binder backbone and grafted onto the resin's available hydroxyl groups. Photoacid degradation of those groups during exposure and/or post-exposure heating provides the polar acetic acid ether moiety pendant to the resin binder backbone. Other preferred acid labile groups pendant to a resin binder backbone include oxycarbonyl groups such as those of the formula $-C(=O)OR^3$ where $R^3$ is as defined above and preferably is t-butyl or benzyl. Such groups are provided by reaction of a resin binder precursor with a suitable addition compound such as a di-alkyl-dicarbonate, e.g. di-t-butyl-dicarbonate. See U.S. Pat. No. 5,258,257 to Sinta et al. and other documents cited therein for discussions of acid labile groups.

Preferred inert blocking groups to functionalize phenolic OH moieties of phenolic resin binder precursors are disclosed in U.S. Pat. No. 5,514,520 to Thackeray et al. As specified in that patent, and referred to herein, an inert blocking group is a group pendant to a resin and that is chemically unreactive in the presence of acid or base generated during exposure and baking of the photoresist composition. Preferred inert blocking groups grafted onto available hydroxyl groups of a resin binder include alkyl (to provide —O-alkyl pendant groups) such as methyl, ethyl, propyl, n-butyl, sec-butyl, t-butyl, etc.; alkanoyl group (to provide RCOO— pendant groups where R is preferably $C_1$, alkyl); a sulfonyl acid ester such as methanesulfonyl, ethanesulfonyl, propanesulfonyl, benzensulfonyl, toulenesulfonylesters, etc. Such groups may be grafted onto a suitable resin binder precursor such as a phenolic resin by an alkaline or acidic condensation reaction with a suitable addition compound, e.g. reaction of a sulfonic acid halide or other compound with suitable leaving group with a phenolic polymer in the presence of a suitable catalyst such as sodium hydroxide in the case of an alkaline condensation. See also the procedures disclosed in U.S. Pat. No. 5,514,520.

In accordance with the invention, the reaction of the resin binder precursor and the addition material is conducted in a selected resist solvent, e.g. a propionate such as ethyl ethoxy propionate (EEP), a glycol ether acetate such as propylene glycol monomethyl ether acetate (PGMEA), a glycol ether such as propylene glycol monomethyl ether (PMA), or a lactate such as methyl lactate or ethyl lactate. Other suitable solvents include other glycol ethers such as 2-methoxyethyl ether (diglyme), ethylene glycol monomethyl ether, ethylene glycol monomethyl ether, and the like; a Cellosolve ester such as methyl Cellosolve acetate; an aromatic hydrocarbon such as toluene or xylene; or a ketone such as methyl ethyl ketone.

Preferably the reaction to form the resin binder is conducted under conditions which minimize or eliminate undesired side reactions and products. Thus, for example, the polymerization reaction should not exhibit significant temperature changes which could promote formation of side products. Preferably, the reaction can proceed at room temperature or slightly elevated temperature such as up to about 40° C. over two or more hours. Also, preferably the reaction proceeds to substantial completion under such conditions, e.g. the reaction proceeds so that there is less than about 5 mole % of unreacted starting material, more preferably less than about 2 mole % of unreacted starting material, still more preferably less than about 1 or 0.5 mole % of unreacted starting material.

Thus, a catalyst should be employed that permits a reaction to proceed under moderate conditions to substantial completion. In the case of an acid-catalyzed condensation to provide pendant acid-labile groups, it has been found that moderate strength catalysts such oxalic acid or malonic acid can give satisfactory reaction rates with little change in reaction temperature. Stronger catalysts such as p-toluenesulfonic acid can result in significant reaction exotherms, which can cause formation of undesired side products. Similarly, weaker acids, such as p-hydroxybenzoic acid, may be less preferred because such catalysts can provide inadequate reaction rates at desired reaction temperatures. Generally, an acid catalyst having a pKa (measured in water at 25° C.) of from about 1 to 4 will be preferred. Basic catalysts also can be employed in a base-catalyzed condensation reaction, e.g. inorganic bases such as sodium hydride or sodium hydroxide, or an organic base such as N,N-dimethylaminopyridine, can be used to graft pendant acid labile groups or inert blocking groups onto available hydroxyl groups of a phenolic polymer.

As discussed above, the invention provides improved methods for synthesizing resist resin binders, which may be employed in the one-pot resist preparation methods of the invention as well as in multi-step resist preparation processes.

More specifically, those methods include reacting the resin binder precursor and addition compound under substantially anhydrous conditions, preferably in the presence of less than about 1.0 weight percent of water, more preferably less than about 0.5 weight percent of water.

Such anhydrous conditions can be provided by a variety of techniques. A preferred method includes treatment of the resin binder precursor in solution with molecular sieves prior to reaction with the addition compound. Suitable molecular sieves are commercially available and preferably have pore sizes of less than about 10 angstroms. Suitably about 5 to 10 percent by weight of molecular sieves (based on weight of solvent) may be added to the resin binder precursor to provide the desired dehydrating effect. See Example 3 which follows for exemplary conditions.

Additionally, the resin binder precursor in solution may be azeotroped prior to reaction with the addition compound to provide substantially anhydrous conditions. For this aspect of the invention, the solvent in which the resin binder precursor is dissolved should form an azeotrope with water, or have a boiling point in excess of 100° C. such as an aromatic solvent, e.g. toluene or xylene. Propylene glycol methyl ether acetate forms a suitable azeotrope with water. The dehydrating distillation is preferably carried out under reduced pressure with heating, e.g. at about 15 to 70 mmHg pressure. Suitable temperatures can vary based on the distillation pressure and boiling point of the solvent and may be e.g. from about 30 to 60° C.

Once the resin binder has been synthesized in the desired solvent, the resin binder may be treated with an ion exchange material promptly after synthesis of the resin and prior to further treatment of the resin, e.g. in the case of a one-pot synthesis prior to addition of the photoactive component, or in the case of a multi-step synthesis, prior to isolation or any purification of the resin binder. If the resin binder was prepared in an acid-mediated reaction, a basic ion exchange material should be employed to remove traces of the catalyst. If the resin binder was prepared in an alkaline-mediated reaction, an acidic ion exchange material should be employed to remove traces of the catalyst. Suitable ion-exchange materials are commercially available and described in the literature, including e.g. Kirk-Othmer, Encyclopedia of Chemical Technology, volume 14, (Fourth Edition), 1995, pp. 737–783, especially 737–749. Suitable acidic exchange resins include the styrene-divinyl benzene sulfonic acidic cation resins such as Amberlyst 15, Amberjet 200H, Amberlite IRN77, Diaion SAN 1, Dowex 50WX2, Dowex 50WX4 and Dowex 50WX8 resins. Suitable basic anion exchange resins include styrene-divinyl benzene resins having amine substitution such as Dowex SBR, Dowex N-196, Amberlite IRA-400(OH), Amberlyst A260H and Amberlite IRN-78 resins. Other suitable basic exchange resins include Amberlite IRA-42, Amberlite IRA-96, Diaion WA21J, Diaion WA30, Dowex WBR-2, Dowex N-283, Dowex 66 MWA-1 and Duolite A378 resins.

After completion of the reaction to form the desired resin binder, and any subsequent treatment such as with an ion exchange material, a photoactive compound may be added to the solution to provide the desired photoresist composition. Preferably a photoacid generator is employed as the photoactive component and will be present in a resist composition in an amount sufficient to generate a latent image in a coating layer. A variety of photoacid generators may be employed. For example, sulfonate compounds are preferred PAGs, particularly sulfonate salts. Two specifically preferred agents are of the following structures 1 and 2:

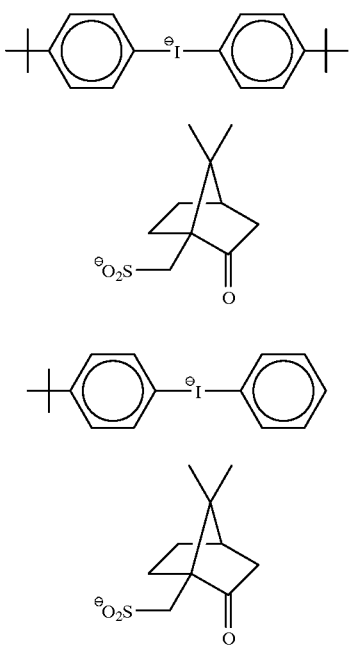

Such sulfonate compounds can be prepared as disclosed in European Patent Application 96118111.2 (publication number 0783136). Briefly, PAG 1 can be prepared by reaction of a mixture of potassium iodate, t-butylbenzene and acetic anhydride with sulfuric acid added dropwise to the reaction mixture with ice-bath cooling. The reaction mixture is then stirred at room temperature for approximately 22 hours, water added with cooling to about 5–10° C. and then washing with hexane. The aqueous solution of diaryliodium hydrogensulfate is then cooled to 5–10° C. and then (+/–)-10-camphorsulfonic acid added followed by neutralization with ammonium hydroxide. Sulfonate PAG 2 above can be prepared by those same procedures, except approximately molar equivalents of t-butyl benzene and benzene would be reacted together in the first step with acetic anhydride and $KIO_3$.

Suitable sulfonated esters also have been reported in J. of Photopolymer Science and Technology, vol. 4, No. 3, 337–340 (1991), incorporated herein by reference, including benzoin tosylate, t-butylphenyl alpha-(p-toluenesulfonyloxy)-acetate and t-butyl alpha-(p-toluenesulfonyloxy)-acetate. Preferred sulfonate PAGs are also disclosed in U.S. Pat. No. 5,344,742 to Sinta et al.

Onium salts are preferred acid generators for resists prepared in accordance with the invention. Onium salts that weakly nucleophilic anions have been found to be particularly suitable. Examples of such anions are the halogen complex anions of divalent to heptavalent metals or non-metals, for example, Sb, Sn, Fe, Bi, Al, Ga, In, Ti, Zr, Sc, D, Cr, Hf, and Cu as well as B, P, and As. Examples of suitable onium salts are diaryl-diazonium salts and onium salts of group Va and B, Ia and B and I of the Periodic Table, for example, halonium salts, quaternary ammonium, phosphonium and arsonium salts, aromatic sulfonium salts and sulfoxonium salts or selenium salts. Examples of suitable preferred onium salts can be found in U.S. Pat. Nos. 4,442,197; 4,603,101; and 4,624,912.

Other useful acid generators include the family of nitrobenzyl esters, and the s-triazine derivatives. Suitable s-triazine acid generators are disclosed, for example, in U.S. Pat. No. 4,189,323. Non-ionic photoacid generators are suitable including halogenated non-ionic, photoacid generating compounds such as, for example, 1,1-bis(p-chlorophenyl)-2,2,2-trichloroethane (DDT); 1,1-bis(p-methoxyphenol)-2,2,2-trichloroethane; 1,1-bis(chlorophenyl)-2,2,2 trichloroethanol; tris(1,2,3-methanesulfonyl)benzene; and tris(trichloromethyl)triazine. Suitable photoacid generators are also disclosed in European Patent Application Nos. 0164248 and 0232972.

Photoresists prepared in accordance with the invention may contain other components, e.g., a dye compound. Other optional photoresist materials include anti-striation agents, plasticizers, speed enhancers, etc. Such optional additives typically will be present in minor concentration in a photoresist composition except for fillers and dyes which may be present in relatively large concentrations such as, e.g., in amounts of from about 5 to 30 percent by weight of the total weight of a resist's dry components.

The resist compositions of the invention can be readily prepared by those skilled in the art. In a one-pot preparation method of the invention, as discussed above, a photoactive component can be added to the solution containing the resin binder component to provide a positive-acting resist. Negative-acting resists would typically include adding of a crosslinking compound to the resin binder component in addition to a photoactive component. Typically, the solids content of a resist composition varies between about 5 and 35 percent by weight of the total weight of the photoresist composition. The resin binder and PAG components should be present in amounts sufficient to provide a film coating layer and formation of good quality latent and relief images.

If desired, the resist composition may be filtered prior to use, or a solution of the resist resin binder may be filtered prior to addition of the photoactive component or other additives during formulation of the resist.

Photoresist compositions prepared in accordance with the invention can be used in accordance with generally known procedures. Thus, for example, a liquid coating composition of the invention is applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon or silicon dioxide wafers for the production of microprocessors and other integrated circuit components. Aluminum-aluminum oxide, gallium arsenide, ceramic, quartz or copper substrates also may be employed. Substrates used for liquid crystal display and other flat panel display applications are also suitably employed, e.g. glass substrates, indium tin oxide coated substrates and the like.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, an activating exposure wavelength is employed and the exposure energy typically ranges from about 10 to 300 $mJ/cm^2$, dependent upon the exposure tool and the components of the photoresist composition.

Following exposure, a film layer of a resist composition can be baked e.g. at temperatures ranging from about 70° C. to about 160° C. Thereafter, the film is developed, typically with an alkaline aqueous based developer such as a tetra-alkyl ammonium hydroxide aqueous solution. Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a plasma gas etch (e.g. an oxygen plasma etch) and a hydrofluoric acid etching solution. After such processing, resist may be removed from the processed substrate using known stripping procedures.

All documents mentioned herein are incorporated herein in their entirety by reference.

The following non-limiting examples are illustrative of the invention.

EXAMPLES 1–2
One-pot resist preparation methods

Example 1

4 kg of poly(hydroxystyrene) was added to a 5 gallon reaction vessel. 12 kg of propylene glycol monomethyl ether was added to the reaction vessel and the mixture agitated overnight for complete dissolution of the polymer. 2.4 g of malonic acid catalyst was added to the solution and the mixture stirred for 30 minutes. At that point, 1113.2 g of methoxypropene was added to the mixture and stirring was continued for 2 days. At that point, samples were removed, quenched with aluminum oxide, and NMR was taken to confirm if reaction was complete. If reaction complete, aluminum oxide was added to reaction vessel to quench reaction. The desired photoactive compound is then added to the reaction solution to provide the desired photoresist composition which can be employed without isolation of the resin binder component.

Example 2

Polyhydroxystyrene (PHS) (5403 grams, 45.03 moles) was placed in a kettle and stirred for 3 to 5 hours with 20 kg of propyleneglycol monomethyl acetate (PMA) to completely dissolve the base ploymer. Di-tertbutyldicarbonate (1890 g, 8.668 moles) dissolved in 1890 grams of PMA was then added to the solution of PHS in PMA followed by the addition of solution of 0.214 grams of N,N-dimethylaminopyridine in 800 grams of PMA. A 50 gram sample of the reaction mixture was taken out for dissolution rate testing and monitoring the reaction by infrared spectroscopy for the complete consumption of di-tertbutyldicarbonate. The polymer solution is then directly formulated, without isolation of the polymer, to required specifications to provide the desired photoresist formulation by addition of the photoactive component and any other resist components.

Example 3
Water removal by molecular sieves

Fifty grams (0.417 mol) of hydrogenated poly (vinylphenol) (Maruzen PHM-C grade) was added to 150 g of propyleneglycolmonomethyl ether (PMA) in a flask and stirred. After it was dissolved 10 g of size 4 Å molecular sieves were added and stirring was continued for 1 hour. The sieves were filtered off, 30 mg of malonic acid was added, stirred until completely dissolved (ca. 30 minutes), and then 2-methoxypropene (12.01 g; 0.167 mol) was added to the flask all at once. After stirring 18 hours at room temperature, 4 g of PMA condition, basic ion exchange beads (A26-OH from Rohm & Haas Co.) was added and it was allowed to stir for 3 hours. The beads were filtered off using a 0.2 $\mu$ filter and the solution stored at room temperature. A polymer with a substitution level of 30% was achieved. The control lot which did not utilize any drying agent was substituted to only 20%.

Example 4
Azeotropic water removal

A solution of polyhydroxystyrene (PHS) (52.33 g, 0.436 moles) MW=8000, in 165 g propyleneglycol monomethylether acetate (PGMA) was placed in a flask and hooked to a vacuum system through a distillation unit. The drying of the polymer solution was then accomplished by removing PGMA/water solution under reduced pressure. The flask was cooled, 100 mg of trifluoroacetic acid was added followed by a dropwise addition of ethyl vinyl ether (7.85 g, 0.109 moles) dissolved in PGMA and stirred for 16 hours. At the end of the reaction 18 g of basic alumina was added, stirred for 2 hours and filtered through a 1 micron pan cake filter. $^1$H NMR indicated a 1-ethoxy-1-ethyl content of 24%. This is very close to the expected level of 25% (based on loading).

Example 5
Use of ion exchange material

Fifty grams (0.417 mol) of hydrogenated poly (vinylphenol) (Maruzen PHM-C grade) was added to 150 g of propyleneglycolmonomethyl ether (PMA) in a flask and stirred. After it was dissolved, 30 mg of malonic acid was added and the acid was stirred until completely dissolved (ca. 30 minutes). 2-Methoxypropene (12.01 g; 0.167 mol) was then added to the flask all at once. After stirring 18 hours at room temperature, 4 g of PMA conditioned, basic ion exchange beads (A26-OH from Rohm & Haas Co.) was added and it was allowed to stir for 3 hours. The beads were filtered off using a 0.2 $\mu$ filter and the solution stored at room temperature. After 10 days at room temperature no change in dissolution rate was observed with a photoresist containing the polymer whereas a control experiment of a comparable photoresist that contained a resin binder of the same polymer that was prepared without any ion exchange material showed a 10-time increase in dissolution after 10 days after the resist was prepared.

The foregoing description of the invention is merely illustrative thereof, and it is understood that variations and modifications can be effected without departing from the spirit or scope of the invention as set forth in the following claims.

What is claimed is:

1. A method for preparation of a photoresist composition comprising:
   (a) preparing a photoresist resin binder in a selected photoresist solvent which comprises reacting a phenolic polymer with a compound that forms a covalent linkage to hydroxyl groups of the resin, and
   (b) without isolation of the resin binder from the solvent, adding a photoactive component to the resin binder to thereby provide the photoresist composition in the solvent.

2. The method of claim 1 wherein the resin binder is a phenolic polymer with pendant acid labile groups.

3. The method of claim 1 wherein the resin binder is a phenolic polymer with pendant inert blocking groups.

4. The method of claim 1 wherein a mixture of a resin binder precursor in a solvent is treated to be substantially anhydrous prior to reaction with the addition compound.

5. The method of claim 1 wherein a mixture of a resin binder precursor in a solvent is treated to have less than about 1 wt. % of water prior to reaction with the addition compound.

6. The method of claim 4 wherein the mixture of the resin binder precursor in the solvent is contacted with molecular sieves prior to reaction with the addition compound.

7. The method of claim 4 wherein the mixture of the resin binder precursor in the solvent is azeotroped prior to reaction with the addition compound.

8. The method of claim 1 wherein a resin binder precursor and an addition compound are reacted in the presence of an acid catalyst and basic ion exchange material is added to resin binder after reaction of the resin binder precursor and addition compound.

9. The method of claim 1 wherein a resin binder precursor and an addition compound are reacted in the presence of an alkaline catalyst and acidic ion exchange material is added to resin binder after reaction of the resin binder precursor and addition compound.

10. The method of claim 1 wherein the solvent is a propionate, a glycol ether or a lactate.

11. The method of claim I wherein the solvent is ethyl ethoxy propionate, propylene glycol monomethyl ether, propylene glycol monomethyl ether acetate, methyl lactate or ethyl lactate.

12. A method for preparation of a photoresist composition comprising:

(a) treating a mixture of a photoresist resin binder precursor and a solvent to be substantially anhydrous;

(b) reacting the resin binder precursor in the solvent with an addition compound to provide a photoresist resin binder; and (c) admixing the resin binder with a photoactive compound to provide a photoresist composition.

13. The method of claim 12 wherein the resin binder is a phenolic polymer with pendant acid labile groups or inert blocking groups.

14. The method of claim 12 wherein the mixture of the resin binder precursor and the solvent is treated to have less than about 1 wt. % of water prior to reaction with the addition compound.

15. The method of claim 12 wherein the mixture of the resin binder precursor and the solvent is contacted with molecular sieves prior to reaction with the addition compound.

16. The method of claim 12 wherein the mixture of the resin binder precursor and the solvent is azeotroped prior to reaction with the addition compound.

17. The method of claim 1 wherein the photoresist composition is applied to a substrate, imagewise exposed to activating radiation, and developed to provide a photoresist relief image.

18. The method of claim 12 wherein the mixture of the photoresist resin binder precursor and solvent is treated to have less than 0.8 weight percent water, based on total weight of the mixture.

19. The method of claim 12 wherein the mixture of the photoresist resin binder precursor and solvent is treated to have less than 0.5 weight percent water, based on total weight of the mixture.

20. The method of claim 12 wherein the mixture of the photoresist resin binder precursor and solvent is treated to have less than 0.1 weight percent water, based on total weight of the mixture.

21. The method of claim 19 wherein the mixture of the photoresist resin binder precursor and the solvent are azeotroped prior to reaction with the addition compound.

22. The method of claim 12 wherein the resin binder precursor and the addition compound are reacted in the presence of an acid catalyst and basic ion exchange material is added to the resin binder after reaction of the resin binder precursor and addition compound.

23. The method of claim 12 wherein the resin binder precursor and the addition compound are reacted in the presence of an alkaline catalyst and acidic ion exchange material is added to the resin binder after reaction of the resin binder precursor and addition compound.

24. The method of claim 12 wherein the solvent is a propionate, a glycol ether, or a lactate.

25. The method of claim 12 wherein the solvent is ethyl ethoxy propionate, propylene glycol monomethyl ether, propylene glycol monomethyl ether acetate, methyl lactate or ethyl lactate.

26. A method for preparation of a photoresist composition comprising:

(a) preparing a photoresist resin binder in a selected photoresist solvent, the resin binder comprising a phenolic polymer with acid labile groups or a phenolic polymer with pendant inert blocking groups, and (b) without isolation of the resin binder from the solvent, adding a photoactive component to the resin binder to thereby provide the photoresist composition in the solvent.

27. A method for preparation of a photoresist composition comprising:

(a) preparing a photoresist resin binder in a photoresist solvent that comprises one or more solvents selected from the group consisting of a propionate, a glycol and a lactate, and (b) without isolation of the resin binder from the solvent, adding a photoactive component to the resin binder to thereby provide the photoresist composition in the solvent.

28. The method of claim 27 wherein the one or more solvents are selected from the group consisting of ethyl ethoxy priopionate, propylene glycol monomethyl ether, propylene glycol monomethyl ether acetate, methyl lactate and ethyl lactate.

* * * * *